(12) United States Patent
Chiba et al.

(10) Patent No.: US 7,788,948 B2
(45) Date of Patent: Sep. 7, 2010

(54) PROCESS FOR PRODUCING SUBSTRATE

(75) Inventors: Jiro Chiba, Yokohama (JP); Atsuo Hiroi, Funabashi (JP); Ryosuke Sugiura, Funabashi (JP); Ryoji Akiyama, Tokyo (JP); Masaya Matsunaga, Tokyo (JP)

(73) Assignees: Asahi Glass Company, Limited, Tokyo (JP); Asahi Techno Glass Corporation, Funabashi-shi (JP)

( * ) Notice: Subject to any disclaimer, the term of this patent is extended or adjusted under 35 U.S.C. 154(b) by 226 days.

(21) Appl. No.: 11/565,973

(22) Filed: Dec. 1, 2006

(65) Prior Publication Data

US 2007/0130993 A1 Jun. 14, 2007

(30) Foreign Application Priority Data

Dec. 12, 2005 (JP) ............................. 2005-357894

(51) Int. Cl.
*C03B 19/01* (2006.01)
*C03B 19/09* (2006.01)
(52) U.S. Cl. ........................................ 65/17.3; 65/21.1
(58) Field of Classification Search .................. 65/17.3
See application file for complete search history.

(56) References Cited

U.S. PATENT DOCUMENTS 3,762,936 A * 10/1973 Iler ............................. 501/54
4,945,074 A * 7/1990 Blount ........................ 501/53
5,973,865 A * 10/1999 Havens et al. ............... 359/885
6,100,209 A * 8/2000 Bentem et al. ............... 501/19

FOREIGN PATENT DOCUMENTS

JP 10-120439 5/1998

OTHER PUBLICATIONS

Remade Scotland, "Dry Milling of Glass", Jan. 9, 2003, http://www.remade.org.uk/index.php?option=com_content&task=view&id=32&Itemid=314.*
English language abstract of JP 10120439 (Watanabe et al.) copyright 1998.*
Yoshihiko Imanaka, Multilayered Low Temperature Cofired Ceramics (LTCC) Technology, 2005, Springer, p. 132-135.*

* cited by examiner

*Primary Examiner*—Steven P Griffin
*Assistant Examiner*—Cynthia Szewczyk
(74) *Attorney, Agent, or Firm*—Oblon, Spivak, McClelland, Maier & Neustadt, L.L.P.

(57) ABSTRACT

To provide a process for producing a reliable substrate in good yield, by suppressing bleeding of boric acid from a green sheet comprising a powder of borosilicate glass to improve printability of a conductive pattern thereby to prevent disconnection.

A process for producing a substrate which comprises firing a green sheet comprising a powder of borosilicate glass, wherein the powder is one prepared by holding borosilicate glass before pulverization, at a temperature higher by at least 30° C. than the glass transition temperature and lower by at most 50° C. than the softening point of the borosilicate glass for at least 3 hours in the atmosphere, followed by pulverization.

4 Claims, 1 Drawing Sheet

PROCESS FOR PRODUCING SUBSTRATE

BACKGROUND OF THE INVENTION

1. Field of the Invention

The present invention relates to a process for producing a substrate which comprises firing a green sheet comprising a powder of borosilicate glass.

2. Discussion of Background

Heretofore, it has been common to produce a circuit substrate by applying a slurry containing a powder of borosilicate glass onto a flat plate, followed by drying to obtain a green sheet, then printing a conductive pattern of a conductive ink on the surface of the green sheet, followed by firing. Such a green sheet comprising a powder of borosilicate glass can be sintered at a temperature of not higher than 1,000° C., and accordingly, it can be fired simultaneously with a low resistance conductor such as Cu, Ag or Au, and is thus industrially advantageous. Further, $B_2O_3$ in the borosilicate glass has a function to suppress heat shrinkage of glass, and is preferred also with a view to improving dimensional precision or suppressing a strain with the conductive pattern. Further, as the boron concentration is high, it is possible to suppress the dielectric constant and the dielectric loss to be low, thus leading to a merit such that it is possible to obtain a substrate excellent in the electrical characteristics.

However, with a green sheet employing a powder of borosilicate glass, it may happen that moisture in air will act on boron in the surface layer to precipitate crystals of boric acid or boron hydroxide (bleeding of boric acid), whereby printing irregularity is likely to result at the time of forming a conductive pattern, thus leading to disconnection. In order to prevent such bleeding of boric acid, it has been proposed to add an alumina powder to a powder of borosilicate glass and carry out preliminary firing at a temperature of at least the glass transition point and at most the softening point of the borosilicate glass thereby to have $B_2O_3$ and alumina reacted (Patent Document 1).

Patent Document 1: JP-A-10-120439

However, according to Patent Document 1, powder particles tend to be bonded one another to form relatively large agglomerates, which are required to be again pulverized before making a slurry, whereby the number of steps is likely to be increased, thus leading to an increase of the cost. Further, a non-reacted alumina powder may remain and make it difficult to control the composition of the desired green sheet.

SUMMARY OF THE INVENTION

The present invention has been made under such circumstances, and it is an object of the present invention to provide a process for producing a reliable substrate in good yield, by suppressing bleeding of boric acid from a green sheet comprising a powder of borosilicate glass to improve printability of a conductive pattern thereby to prevent disconnection.

To solve the above-mentioned problems, the present invention provides the following process for producing a substrate.

(1) A process for producing a substrate which comprises firing a green sheet comprising a powder of borosilicate glass, wherein the powder is one prepared by holding borosilicate glass before pulverization, at a temperature higher by at least 30° C. than the glass transition temperature and lower by at most 50° C. than the softening point of the borosilicate glass for at least 3 hours in the atmosphere, followed by pulverization.

(2) The process for producing a substrate according to the above (1), wherein the pulverization is carried out in a dry system while steam is supplied (3) The process for producing a substrate according to the above (1) or (2), wherein after the pulverization, the obtained powder is held in an atmosphere with a relative humidity of at least 55% at a temperature of at least 30° C.

(4) The process for producing a substrate according to the any one of the above (1), (2) and (3), wherein the borosilicate glass has a $B_2O_3$ content of at least 15 mol %.

According to the present invention, it is possible to produce a reliable substrate provided with a good conductive pattern free from bleeding of boric acid and free from disconnection even by such a simple method wherein at the time of pulverizing borosilicate glass into a powder, the glass before the pulverization is heated at a specific temperature.

Further, as bleeding of boric acid is suppressed, the $B_2O_3$ content in the borosilicate glass may be made higher. It is thereby possible to carry out firing at a lower temperature, whereby the heat shrinkage may be made smaller, and the strain with the conductive pattern will accordingly be less, and the dimensional precision will be improved. Further, the dielectric constant and the dielectric loss will be lower, and the electric characteristics of the substrate thereby obtainable will be more improved.

DETAILED DESCRIPTION OF THE PREFERRED EMBODIMENTS

Figure 1:
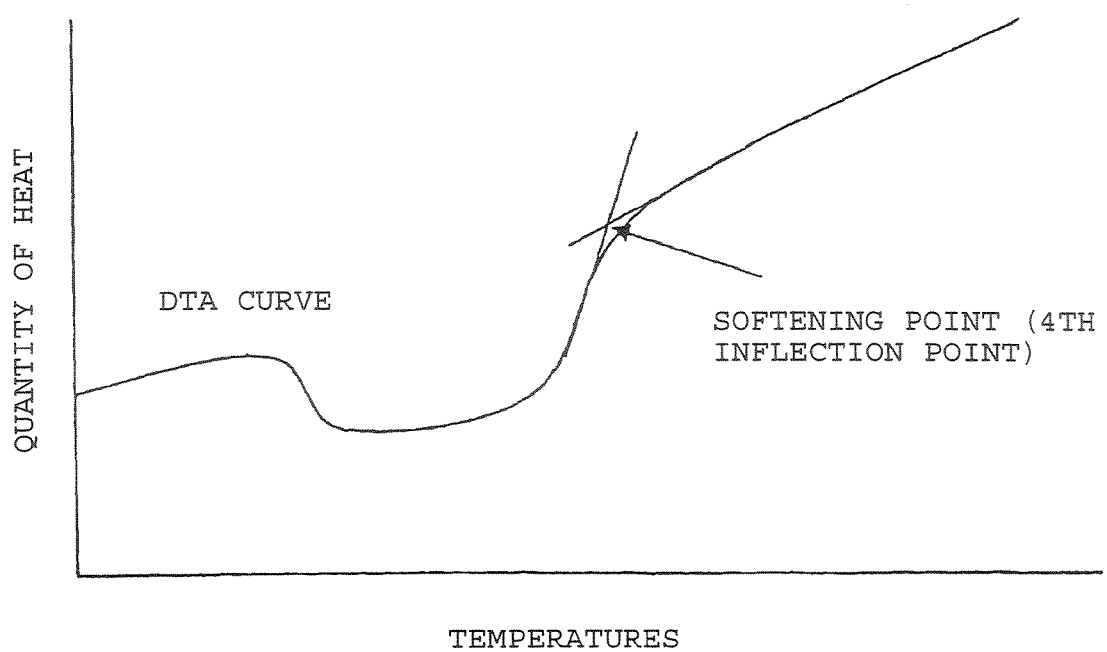
FIG. 1 is a view illustrating the method for determining the softening point.

Now, the present invention will be described in detail.

In the present invention, the substrate is prepared from a green sheet comprising a powder of borosilicate glass, but the process is basically the same as the conventional process. Firstly, the powder of borosilicate glass is kneaded with an organic solvent, an organic binder and, if necessary, a plasticizer such as dibutyl phthalate, dioctyl phthalate or butylbenzyl phthalate, etc. to prepare a slurry. Then, this slurry is applied in a predetermined thickness on a resin sheet such as a polyethylene terephthalate film by a doctor blade method or the like, followed by drying to prepare a green sheet. And, by using a conductive ink, a conductive pattern is printed on the surface of the green sheet, followed by firing in the atmosphere to obtain a substrate. Otherwise, green sheets having conductive patterns printed and through holes formed, may be laminated and fired to obtain a substrate having a multilayered structure.

The organic solvent may, for example, be toluene, xylene, methyl ethyl ketone, butanol, isopropyl alcohol, dibutyl phthalate, dioctyl phthalate or butylbenzyl phthalate, and the organic binder may, for example, be a polyvinyl butyral or an acrylic resin. However, the organic solvent or binder is not limited thereto.

Further, to the slurry, a filler may be incorporated for the purpose of increasing the strength of the substrate to be obtained. The amount of the filler to be incorporated is preferably at most 70%, more preferably at most 50%, by volume %. The filler is preferably a ceramics powder having a melting point or a transition temperature of at least 1,000° C., or a glass powder having a softening point of at least 1,000° C. More preferably, it is a powder of at least one inorganic substance selected from the group consisting of α-quartz (transition temperature: 1,450° C.), amorphous silica (softening point: 1,500° C.), alumina (melting point: 2,050° C.), magnesia (melting point: 2,820° C.), forsterite (melting point: 1,890° C.), cordierite (transition temperature: 1,450° C.), mullite (melting point: 1,850° C.), zircon (melting point: 1,680° C.) and zirconia (melting point: 2,710° C.).

In the present invention, employed as the powder of borosilicate glass is one obtained by holding borosilicate glass before pulverization at a temperature higher by at least 30° C. than the glass transition point (the lower limit temperature) and lower by at most 50° C. than the softening point (the upper limit temperature) of the borosilicate glass for at least 3 hours in the atmosphere, followed by pulverization. By such a specific heat treatment, phase separation takes place in the borosilicate glass before pulverization, so that a so-called "sea-island structure" is formed having a boron-rich phase dispersed in a $SiO_2$ matrix. The sizes of islands of a boron-rich phase in such a sea-island structure are preferably at least 5 nm, more preferably at least 10 nm. The heating conditions are adjusted to bring the islands to have such sizes. At the time of the heating, if the treatment is carried out at a temperature lower than the above lower limit temperature, it takes time for the phase separation, and the efficiency tends to be poor. Further, borosilicate glass before pulverization is, for example, in the form of flakes, and will be heated as put in a heating container. Accordingly, if the treatment is carried out at a temperature exceeding the above upper limit temperature, softening of the glass tends to be vigorous, and the glass undergoes fusion in the heating container to form a large block, whereby pulverization tends to be difficult, and the molten glass tends to deposit or stick also on the inner wall of the heating container. More preferred heating conditions are such that the heating is carried out at a temperature higher by at least 50° C. than the glass transition point and lower by at most 100° C. than the softening point of the borosilicate glass for at least 5 hours. Here, as the borosilicate glass before pulverization, one naturally broken as a result of passing molten glass through rolls, followed by cooling, is preferred from the viewpoint of the handling efficiency and heat efficiency, and the size of flakes is usually such that the thickness is from 0.5 to 2 mm, the width is from 2 to 3 cm, and the length is from 4 to 5 cm.

The borosilicate glass thus heat-treated, is pulverized into a glass powder. The glass powder is added together with an organic binder, etc. to an organic solvent, followed by stirring and mixing to obtain a slurry. If, at that time, the boron-rich phase is exposed on the surface of the glass powder, the boron will dissolve in the organic solvent. Therefore, the slurry is considered to be one having a glass powder free from boron on its surface dispersed. And, this slurry is applied and dried to form a green sheet. Here, it is considered that during the drying, the dissolved boron will be removed together with the organic solvent, and the dispersed glass powder is free from boron on its surface, and accordingly, the glass sheet will be one having no boron present on its surface and will be free from bleeding of boric acid.

Here, the pulverization may be carried out in a dry system, and in such a case, it is preferred to carry out pulverization while steam is supplied. The steam will deposit as waterdroplets on the surface of the glass powder, and boron will dissolve into such waterdroplets, whereby together with the dissolution of boron during the above-mentioned preparation of the slurry, the boron removal rate will be high. In the case of carrying out the pulverization in a wet system, the pulverization may be carried out in a medium such as water or an organic solvent. Among them, it is preferred to use a medium having a hydroxyl group such as water, ethanol or isopropyl alcohol, whereby boron can be removed from the glass powder during the pulverization. Further, the size of the glass powder obtainable is not particularly limited, but it is suitably from 1 to 5 μm.

Further, after the pulverization, the glass powder is preferably held in an atmosphere with a relative humidity of at least 55%, preferably from 60 to 80%, at a temperature of at least 30° C., preferably at least 40° C. By this treatment, boron at the surface of the glass powder will dissolve in the moisture in the atmosphere, whereby the boron removal rate will further be improved.

In the present invention, as an example of the borosilicate glass before pulverization, a glass consisting essentially of, by mol %, from 58 to 70% of $SiO_2$, from 15 to 30% of $B_2O_3$, from 5 to 10% of $Al_2O_3$ and from 3 to 10% of CaO, may be mentioned.

$SiO_2$ is a network former and a component to lower the dielectric constant. If it is less than 58%, the chemical durability tends to be low, or the dielectric constant tends to be high. It is preferably at least 60%. If it exceeds 70%, the glass melting temperature tends to be high, or the softening point tends to be high, whereby the firing temperature is obliged to be higher than 900° C. It is preferably at most 66%, more preferably at most 64%.

$B_2O_3$ is a network former, and if it is less than 15%, the glass melting temperature tends to be high. It is preferably at least 20%, more preferably at least 24%, particularly preferably at least 26%. If it exceeds 30%, the chemical durability tends to deteriorate. It is preferably at most 28%. According to the present invention, even when borosilicate glass having such a high $B_2O_3$ concentration is employed, it is possible to control bleeding of boric acid.

$Al_2O_3$ is a component to stabilize the glass. If it is less than 5%, the glass is likely to be unstable. It is preferably at least 7%. If it exceeds 10%, the glass melting temperature tends to be high, or the firing temperature tends to be high. It is preferably at most 9%, more preferably at most 8%.

CaO is a component to lower the glass melting temperature, or to lower the softening point, or to stabilize the glass. If it is less than 3%, the melting temperature of the glass tends to be high, the firing temperature tends to be high, or the glass is likely to be unstable. If it exceeds 10%, the glass rather tends to be unstable.

The borosilicate glass of this example consists essentially of the above-mentioned four components, but may contain other components depending upon a particular purpose. In such a case, the content of such other components is preferably at most 10%, more preferably at most 5%, in total. An alkali metal such as lithium, sodium or potassium is likely to deteriorate the electric insulation properties or increase the dielectric loss, and should preferably be not contained, and even if contained, it should be not more than 1%. Further, antimony is likely to release oxygen during firing thereby to oxidize the electrode, and should preferably be not contained. Further, strontium is likely to increase the dielectric constant and should preferably be not contained. Further, zinc is likely to deteriorate the acid resistance and should preferably be not contained.

Further, the glass transition point is preferably at most 650° C.

Further, taking into the electrical characteristics of the substrate to be obtained into consideration, the dielectric constant is preferably at most 4.7, more preferably at most 4.5. The lower limit is typically at least 4. Further, tan δ is preferably at most 0.0025, more preferably at most 0.0010. The lower limit is typically at least 0.0001.

Further, the temperature for firing the green sheet made of the borosilicate glass is preferably at most 1,000° C. If it exceeds 1,000° C., simultaneous firing with the electrode tends to be difficult. Further, in order to suppress diffusion of the electrode material into the substrate during the firing, it is preferred to carry out the firing at a lower temperature, and the firing temperature is more preferably at most 950° C., further preferably at most 900° C., particularly preferably at most 850° C. Here, in order to have a printed conductive ink sintered well, the firing is preferably carried out at a temperature of at least 800° C. Taking these into consideration, the firing temperature is most preferably within a range of from 800 to 900° C.

Now, the present invention will be described in further detail with reference to Examples and Comparative Examples, but it should be understood that the present invention is by no means thereby restricted.

Preparation of Borosilicate Glass Flakes

Materials were mixed so that the composition became by mol %, 65% of $SiO_2$, 25% of $B_2O_3$, 5% of $Al_2O_3$ and 5% of CaO, put into a platinum crucible and held at 1,650° C. for 2 hours to obtain a molten glass. This molten glass was stretched by water-cooled rollers to form a sheet having a thickness of from 0.5 to 2.0 mm. The sheet passed through the rolls was naturally broken by cooling to form flakes having a thickness of from 0.5 to 2 mm, a width of from 2 to 3 cm and a length of from 4 to 6 cm.

Measurement of Glass Transition Point

A part of the molten glass was put into a mold of 1 mm×10 mm×20 mm, and a molded product of a flat plate shape was obtained. Then, this molded product was annealed from 640° C. at a cooling rate of 3° C./min, and after the annealing, grinding and polishing were carried out to process the molded product into a cylindrical shape having a diameter of 4 mm and a height of 20 mm to obtain a sample. And, using this sample, the linear expansion coefficient was measured in accordance with a test method for an average expansion coefficient of glass as disclosed in JIS R3102, and the first inflection point of the expansion curve was taken as the glass transition point. The glass transition point of the prepared borosilicate glass was 624° C.

Measurement of Softening Point

A part of the above molded product was pulverized in an alumina mortar and sieved through a screen of 300 mesh to obtain a powder as a sample. With respect to this sample, a DTA curve was obtained by means of a differential thermal analysis device (DTA, manufactured by Rigaku Corporation) at a temperature-rising rate of 15° C./min, and its 4th inflection point was obtained as shown in Table 1, which was taken as the softening point. The softening point of the prepared borosilicate glass was 896° C.

EXAMPLE 1

The borosilicate glass flakes obtained as described above, were put into an alumina container and heated in the atmosphere at 700° C. for 5 hours. After the heating, the borosilicate glass flakes were taken out from the alumina container and pulverized by a dry system vibration ball mill for 2 hours and sieved through a screen of 300 mesh. The sieved product was again additionally pulverized by a dry system vibration ball mill for 1 hour to obtain a glass powder. The average particle size, the specific surface area and the moisture-deposition amount of this glass powder were measured as described below. The respective measurement results are shown in Table 1.

Average particle diameter (D50%): Measured by means of a laser diffraction diffusion-type particle size distribution meter (Microtrac, manufactured by NIKKISO CO., LTD.) using water as a dispersant.

Specific surface area (BET): Measured by means of a fluid BET1 point type (automatic specific surface area meter, manufactured by NIKKISO CO., LTD.)

Moisture deposition amount: Using a differential thermobalance analyzer (TG-DTA, manufactured by Rigaku Corporation), the sample was heated at a temperature-rising rate of 15° C./min, and the weight reduction from 30 to 450° C. was measured and taken as the moisture-deposition amount.

To 100 parts by weight of a solvent mixture comprising, by mass %, 30% of toluene, 20% of methyl ethyl ketone and 50% of isopropyl alcohol, 40 parts by weight of an acrylic resin (BR106, manufactured by Mitsubishi Rayon Co., Ltd.) as an organic binder and completely dissolved. And, 56 parts by weight of this solution, 10 parts by weight of the glass powder prepared as described above, and 34 parts by weight of alumina (AL-45H, manufactured by Showa Denko K.K.) as a filler, were mixed by a rotary ball mill for 3 hours to obtain a slurry. Then, this slurry was subjected to defoaming by a vacuum defoaming device and then applied onto a polyethylene terephthalate film by a simple doctor blade device. It was dried at room temperature for 12 hours, then dried at 80° C. for 4 hours and further dried at 120° C. for 1 hour to obtain a green sheet having a thickness of 0.3 mm. And, from this green sheet, a sample of 5 cm×5 cm was cut out, put in a constant temperature constant humidity container at a temperature of 40° C. under a humidity of 80%, and every 12 hours, the surface of the sample was observed, and the presence or absence of precipitation of boric acid crystals was ascertained. In Table 1, the time until boric acid crystals precipitated, is shown.

EXAMPLE 2

A glass powder was prepared in the same manner as in Example 1. And, this glass powder was put into a constant temperature constant humidity container at 40° C. under a relative humidity of 60% and held for 16 hours. Thereafter, in the same manner as in Example 1, the average particle size, the specific surface area, the moisture-deposition amount of glass powder, and the time until boric acid crystals precipitated when it was formed into a green sheet, were measured. The results are shown in Table 1.

EXAMPLE 3

The same treatment as in Example 1 was carried out except that the borosilicate glass flakes were heat-treated at 660° C. for 5 hours. The average particle diameter, the specific surface area and the moisture deposition amount of the glass powder, and the time until boric acid crystals precipitated when it was formed into a green sheet, are shown in Table 1.

COMPARATIVE EXAMPLE 1

The borosilicate glass flakes were formed directly into a glass powder without heat treatment. And, in the same manner as in Example 1, the average particle diameter, the specific surface area and the moisture-deposition amount of the glass powder, and the time until boric acid crystals precipitated when it was formed into a green sheet, were measured. The results are shown in Table 1.

TABLE 1

| | | Example 1 | Example 2 | Example 3 | Comparative Example 1 |
|---|---|---|---|---|---|
| Glass composition (mol %) | $SiO_2$ | | | 65 | |
| | $B_2O_3$ | | | 25 | |
| | $Al_2O_3$ | | | 5 | |
| | CaO | | | 5 | |
| Glass characteristics | Transition point (°C.) | | | 624 | |
| | Softening point (°C.) | | | 896 | |
| Heat treatment conditions | Temperature (°C.) | 700 | | 660 | — |
| | Time (hours) | 5 | | 5 | — |
| Pulverization method | | | Dry system ball mill | | |
| Post treatment of glass powder | 40° C., RH60% | Nil | Yes (16 hours) | Nil | Nil |
| Glass powder characteristics | Average particle diameter (D50%) | 3.3 | 3.5 | 3.4 | 3.3 |
| | Specific surface area ($m^2/g$) | 3.7 | 3.5 | 3.7 | 3.8 |
| | Moisture-deposition amount (mass %) | 1.3 | 1.6 | 1.4 | 1.4 |
| Green sheet characteristics | Time until bleeding of boric acid | 48 hours | 72 hours | 24 hours | 12 hours |

As shown in Table 1, according to the present invention, it is possible to suppress bleeding of boric acid from a green sheet by using a glass powder pulverized after the heat treatment of borosilicate glass flakes.

Further, as shown in Example 2, the effect for suppressing bleeding of boric acid can be improved by holding the glass powder under a further high temperature and high humidity condition.

The entire disclosure of Japanese Patent Application No. 2005-357894 filed on Dec. 12, 2005 including specification, claims, drawings and summary is incorporated herein by reference in its entirety.

What is claimed is:

1. A process for producing a substrate comprising:
   heat treating a powder of borosilicate glass,
   pulverizing the heat treated powder of borosilicate glass,
   placing the pulverized heat treated powder of borosilicate glass in an atmosphere with a relative humidity of at least 55% at a temperature of at least 30° C. to remove boron, and
   firing a green sheet comprising the pulverized, heat treated and boron removed powder of borosilicate glass to form the substrate,
   wherein the heat treating of the powder of borosilicate glass consists of holding the powder of borosilicate glass at a temperature for at least 3 hours at atmospheric pressure, the temperature being higher by at least 30° C. than the glass transition temperature of the powder of borosilicate glass and lower by at most 50° C. than the softening point of the powder of borosilicate glass, and
   wherein, after the powder of borosilicate glass is formed, but prior to the heat treating of the powder of borosilicate glass, the powder of borosilicate glass is not previously heat treated.

2. The process for producing a substrate according to claim 1, wherein the pulverization is carried out in a dry system while steam is supplied.

3. The process for producing a substrate according to claim 1, wherein the borosilicate glass has a $B_2O_3$ content of at least 15 mol%.

4. The process for producing a substrate according to claim 1, wherein the heat treating of the powder of borosilicate glass consists of holding the powder of borosilicate glass at a temperature for at least 5 hours in atmospheric conditions, the temperature being higher by at least 50° C. than the glass transition temperature of the powder of borosilicate glass and lower by at most 100° C. than the softening point of the powder of borosilicate glass.

\* \* \* \* \*